United States Patent
Wang et al.

(10) Patent No.: US 9,799,271 B2
(45) Date of Patent: Oct. 24, 2017

(54) GATE DRIVER, DISPLAY APPARATUS AND GATE DRIVING METHOD OF OUTPUTTING A MULTI-PULSE WAVEFORM

(71) Applicant: BOE TECHNOLOGY GROUP CO., LTD., Beijing (CN)

(72) Inventors: Lirong Wang, Beijing (CN); Liye Duan, Beijing (CN); Zhongyuan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 156 days.

(21) Appl. No.: 14/770,364

(22) PCT Filed: Jan. 30, 2015

(86) PCT No.: PCT/CN2015/071918
§ 371 (c)(1),
(2) Date: Aug. 25, 2015

(87) PCT Pub. No.: WO2016/045290
PCT Pub. Date: Mar. 31, 2016

(65) Prior Publication Data
US 2016/0372046 A1    Dec. 22, 2016

(30) Foreign Application Priority Data
Sep. 28, 2014 (CN) .......................... 2014 1 0510753

(51) Int. Cl.
*G09G 3/36* (2006.01)
*G09G 3/3266* (2016.01)
(Continued)

(52) U.S. Cl.
CPC ......... *G09G 3/3266* (2013.01); *G09G 3/3258* (2013.01); *G11C 19/28* (2013.01);
(Continued)

(58) Field of Classification Search
CPC ..... G09G 3/3266; G09G 3/3258; G11C 19/28
(Continued)

(56) References Cited

U.S. PATENT DOCUMENTS

| 5,692,026 A | 11/1997 | Koch, II et al. |
| 2006/0284815 A1* | 12/2006 | Kwon ................. G09G 3/3614 345/98 |

(Continued)

FOREIGN PATENT DOCUMENTS

| CN | 1486482 A | 3/2004 |
| CN | 101105918 A | 1/2008 |

(Continued)

OTHER PUBLICATIONS

First Chinese Office Action for Chinese Patent Application No. 201410510753.7, dated Feb. 1, 2016.
(Continued)

*Primary Examiner* — Jonathan Blancha
(74) *Attorney, Agent, or Firm* — Kinney & Lange, P.A.

(57) ABSTRACT

The present disclosure discloses a gate driver, a display apparatus and a gate driving method, to achieve a function of outputting a multi-pulse waveform by the gate driver. The gate driver according to the present disclosure comprises multiple groups of driving units, each group of driving units comprising N driving units each of which comprises a shift register and a logic circuit, wherein N is an integer larger than 1, and an output of a shift register is connected to a logic circuit in each driving unit. The shift registers multiplex multiple clock signals with different timings. Each of the shift registers outputs an output signal to a corresponding logic circuit. A part of a clock signal is selected by the logic circuit for output. In this way, a function of outputting a multi-pulse waveform by the gate driver is achieved, which prepares for a shift register having a function of threshold (Continued)

voltage compensation, to make a shift register capable of multi-row scanning become feasible on a display panel.

8 Claims, 7 Drawing Sheets

(51) Int. Cl.
    *G09G 3/3258*     (2016.01)
    *G11C 19/28*     (2006.01)

(52) U.S. Cl.
    CPC ............ *G09G 2300/0814* (2013.01); *G09G 2310/0218* (2013.01); *G09G 2310/0286* (2013.01); *G09G 2310/08* (2013.01); *G09G 2320/0233* (2013.01); *G09G 2330/023* (2013.01)

(58) Field of Classification Search
    USPC ........................................................ 345/100
    See application file for complete search history.

(56) References Cited

U.S. PATENT DOCUMENTS

| | | |
|---|---|---|
| 2006/0284820 A1 | 12/2006 | Hong et al. |
| 2007/0248204 A1* | 10/2007 | Tobita ................... G11C 19/28 377/64 |
| 2010/0277206 A1* | 11/2010 | Lee ....................... G09G 3/3677 327/108 |
| 2013/0083885 A1 | 4/2013 | Lee et al. |
| 2014/0313174 A1* | 10/2014 | Murakami ............. G11C 19/28 345/204 |

FOREIGN PATENT DOCUMENTS

| | | |
|---|---|---|
| CN | 101233556 A | 7/2008 |
| CN | 101266769 A | 9/2008 |
| CN | 101281719 A | 10/2008 |
| CN | 101599257 A | 12/2009 |
| CN | 101630475 A | 1/2010 |
| CN | 101783117 A | 7/2010 |
| CN | 102103294 A | 6/2011 |
| CN | 102144253 A | 8/2011 |
| CN | 102654975 A | 9/2012 |
| CN | 104269134 A | 1/2015 |

OTHER PUBLICATIONS

International Search Report and Written Opinion from PCT Application Serial No. PCT/CN2015/071918, dated Jun. 19, 2015, 10 pages.

* cited by examiner

GATE DRIVER, DISPLAY APPARATUS AND GATE DRIVING METHOD OF OUTPUTTING A MULTI-PULSE WAVEFORM

CROSS-REFERENCE TO RELATED APPLICATION(S)

This application claims priority to the Chinese Patent Application No. 201410510753.7, filed on Sep. 28, 2014, entitled "GATE DRIVER, DISPLAY APPARATUS AND GATE DRIVING METHOD" which is incorporated herein by reference in its entirety.

TECHNICAL FIELD

The present disclosure relates to the technical field of displays, and in particular, to a gate driver, a display apparatus, and a gate driving method.

BACKGROUND

As shown in FIG. 1, during display using an active matrix Organic Light Emitting Diode (OLED), various rows of scan lines and various columns of data lines intersect to form an active matrix. Generally, various rows of gating diodes are opened in turn by using a progressive scanning method to apply voltage on the data lines to pixel driving diodes, which convert the voltage into current to drive the OLED to emit light for display.

A driving circuit for the scan lines is typically implemented by using shift registers. The shift registers may be divided into dynamic shift registers and static shift registers in terms of categories. The dynamic shift registers generally have a relatively simple structure, and need a few of Thin Film Transistors (TFTs), but consume large power and operate at a limited frequency bandwidth. The static shift registers need more TFT devices, but operate at a larger bandwidth and consumes less power. With the increase of a size of a display panel, a row scan driving circuit is generally implemented by using TFT transistors made of amorphous silicon (a-Si) or polycrystalline Si (p-Si), and is directly manufactured on the panel. This may eliminate interconnection with a peripheral driving circuit, and reduce the size and cost. The row scan driving circuit which is designed based on a panel has low requirements for the speed, but needs a compact structure and a small occupation area. As a result, the row scan driving circuit is often implemented by using dynamic shift registers. In addition, the conventional shift register which is designed by using a Positive channel Metal Oxide Semiconductor (PMOS) transistor and an N-Mental-Oxide-Semiconductor (NMOS) transistor is relatively complex in terms of process realization, and leads to a high cost (the shift register generally needs to include 7-9 mask plate layers) and large transient current. Therefore, the panel based design typically utilizes a dynamic circuit which merely uses an NMOS or a PMOS. In consideration of the performance of the shift register, it needs to comprehensively consider factors such as an operating voltage, power consumption, reliability, and an area. However, with the gradual increase of the size of the panel, the power consumption and the reliability have become more important performance parameter indexes. Generally, due to material and a film thickness, both threshold voltages Vth (i.e., absolute values thereof) of thin film transistors based on an a-Si process and a low temperature p-Si process are large, which results in a large operating voltage and high power consumption of the shift registers designed by using the thin film transistors.

The exiting Gate driver on Array (GOA) of an array plate is a logic circuit which generates a single-pulse waveform. As shown in FIG. 2, in order to avoid non-uniformity in the display of the panel due to a shift of the Vth, an OLED pixel structure is generally a pixel circuit having a function of internal threshold voltage compensation. When dual pulses are input into the exiting GOA circuit, a simulation result illustrated in FIG. 3 may be generated.

It can be seen from the simulation result in FIG. 3 that if a dual-pulse waveform is input into the existing GOA, the existing GOA is unable to output a dual-pulse waveform. Specifically, a waveform at a point Q cannot be pulled up when a second pulse arrives, and thus the point Q cannot operate normally, which results in the GOA circuit being unable to achieve a function of outputting a multi-pulse waveform.

SUMMARY

The embodiments of the present disclosure provide a gate driver, a display apparatus and a gate driving method, to achieve a function of outputting a multi-pulse waveform by the gate driver.

A gate driver according to an embodiment of the present disclosure comprises: multiple groups of driving units, each group of driving units comprising N driving units each of which comprises a shift register and a logic circuit, wherein N is an integer larger than 1, and an output of a shift register is connected to a logic circuit in each driving unit, wherein an output of a logic circuit in an $m^{th}$ driving unit is connected to a gate scan line of an $m^{th}$ row of pixels, and is connected to an input for a trigger signal of a shift register in an $m+1^{th}$ driving unit, wherein m is in a range of $[1, M-1]$, and M is a total number of rows of pixels;

an output of a logic circuit in a $k^{th}$ driving unit is connected to a reset of a $k-(N-1)^{th}$ of a shift register, wherein k is in a range of $[N, M]$; and all logic circuits in the multiple groups of driving units use a common logic circuit clock signal.

Preferably, in each group of driving units, shift registers in various driving units multiplex N shift register clock signals with different timings, and logic circuits in various driving units output output signals with different timings which have multiple pulses respectively, each of the multiple pulses having a pulse width equal to that of the logic circuit clock signal.

Therefore, the shift registers in the gate driver multiplex multiple clock signals with different timings. Each of the shift registers outputs an output signal to a corresponding logic circuit. A part of a clock signal is selected by the corresponding logic circuit using the output signal from the shift register for output. In this way, a function of outputting a multi-pulse waveform by the gate driver is achieved, which prepares for a shift register having a function of threshold voltage compensation, to make a shift register capable of multi-row scanning become feasible on a display panel, which solves the technical problem of multi-row scanning on a glass panel.

Preferably, the logic circuit in the $m^{th}$ driving unit comprises a first thin film transistor, a second thin film transistor, and an inverter connected between a gate of the first thin film transistor and a gate of the second thin film transistor, wherein a drain of the first thin film transistor is connected to a drain of the second thin film transistor, and acts as an output of the logic circuit; a source of the first thin film transistor acts as an input for the logic circuit clock signal; the gate of the first thin film transistor acts as an input connected to an output of a shift register in the $m^{th}$ driving unit; and a source of the second thin film transistor acts as an input for a low level signal.

Preferably, the logic circuit clock signal has a pulse width equal to a first pulse width and a pulse period equal to a first pulse period; and each of the shift register clock signals has a pulse width equal to a second pulse width and a pulse period equal to a second pulse period, wherein the second pulse width is larger than the first pulse width, and the second pulse period is larger than the first pulse period.

Preferably, the second pulse width is 2*(N−1) times the first pulse width, and the second pulse period is N times the first pulse period, and in each group of driving units, a timing of an n+1$^{th}$ shift register clock signal is the first pulse period later than an n$^{th}$ shift register clock signal; and a logic circuit in each driving unit outputs an output signal having N−1 pulses with a pulse width equal to the first pulse width, and a timing of an output signal of a logic circuit in an n+1$^{th}$ driving unit is the first pulse period later than that of an output signal of a logic circuit in an n$^{th}$ driving unit, wherein n is in a range of [1, N−1].

Preferably, each driving unit comprises a shift register and a logic circuit.

Preferably, a shift register in an m$^{th}$ driving unit comprises a first thin film register, a second thin film register, a third thin film register, a fourth thin film register, a first capacitor, a second capacitor, and a resistor, wherein a gate of the first thin film transistor is shorted to a source of the first thin film transistor, and when m is equal to 1, the gate acts as an input for an initial trigger signal, and when m is larger than 1, the gate is connected to an output of a logic circuit in an m−1$^{th}$ driving unit as an input for a trigger signal of the shift register; and the first thin film transistor is connected to the second thin film transistor in series, a connection point between the first thin film transistor and the second thin film transistor is connected to one end of the first capacitor and a gate of the third thin film transistor, the third thin film transistor is connected to the fourth thin film transistor in series, a connection point between the third thin film transistor and the fourth thin film transistor is connected to the other end of the first capacitor and one end of the resistor, and acts as an output of the shift register, a source of the third thin film transistor acts as an input for a clock signal, both a gate of the second thin film transistor and a gate of the fourth thin film transistor act as a reset of the shift register, the other end of the resistor is connected to one end of the second capacitor, and the other end of the second capacitor, a drain of the second thin film transistor, and a drain of the fourth thin film transistor act as an input for a low level signal.

A display apparatus according to an embodiment of the present disclosure comprises the gate driver according to any of the embodiments of the present disclosure.

A gate driving method using any gate driver described above according to an embodiment of the present disclosure comprises:

in each group of driving units:

inputting shift register clock signals with different timings to a shift registers in various driving units; and inputting a logic circuit clock signal to logic circuits in various driving units, so that after logic operations are implemented on an output signal of a shift register received by a logic circuit in each driving unit and the logic circuit clock signal, the logic circuits in various driving units output output signals with different timings which have multiple pulses respectively, each of the multiple pulses having a pulse width equal to that of the logic circuit clock signal.

DETAILED DESCRIPTION

The embodiments of the present disclosure provide a gate driver, a display apparatus, and a gate driving method, to achieve a function of outputting a multi-pulse waveform by the gate driver.

In the gate driver according to the embodiments of the present disclosure, shift registers in every N (N is an integer larger than 1) driving units use a common group of clock signals. An output signal of each shift register is input into a corresponding logic circuit. The logic circuit processes the output signal of the shift register, and selects a part of a clock signal thereof to finally output a multi-pulse shift signal, and transmits the multi-pulse shift signal to a gate end of a gate scan line of a corresponding row of pixels, so as to implement multi-row scanning. In this way, a function of outputting a multi-pulse waveform by a gate driver is achieved, which prepares for a shift register having a function of threshold voltage compensation, to make a shift register capable of multi-row scanning become feasible on a display panel, which solves the technical problem of multi-row scanning on a glass panel.

The embodiments of the present disclosure will be described below by taking N being equal to 8 as an example. Of course, N may be equal to another value, for example, 9. A specific value of N depends on the time required for scanning a row of pixels.

As a drift of a threshold voltage (Vth) of a TFT may result in non-uniformity in the display of the OLED, in order to eliminate such non-uniformity, many OLED pixel circuit structures have a function of internal threshold voltage compensation, and the operation process of the OLED pixel circuits may generally include a pre-charging phase, a compensation phase, a data writing phase, and a light emitting phase. Compared to a scan waveform of the existing Liquid Crystal Display (LCD) gate driving, a scan waveform of the OLED gate driver may be more complex. The GOA according to the embodiment of the present disclosure has a function of outputting a multi-pulse waveform, which may prepare for the pixel circuit having a function of threshold voltage compensation in advance.

Figure 1:
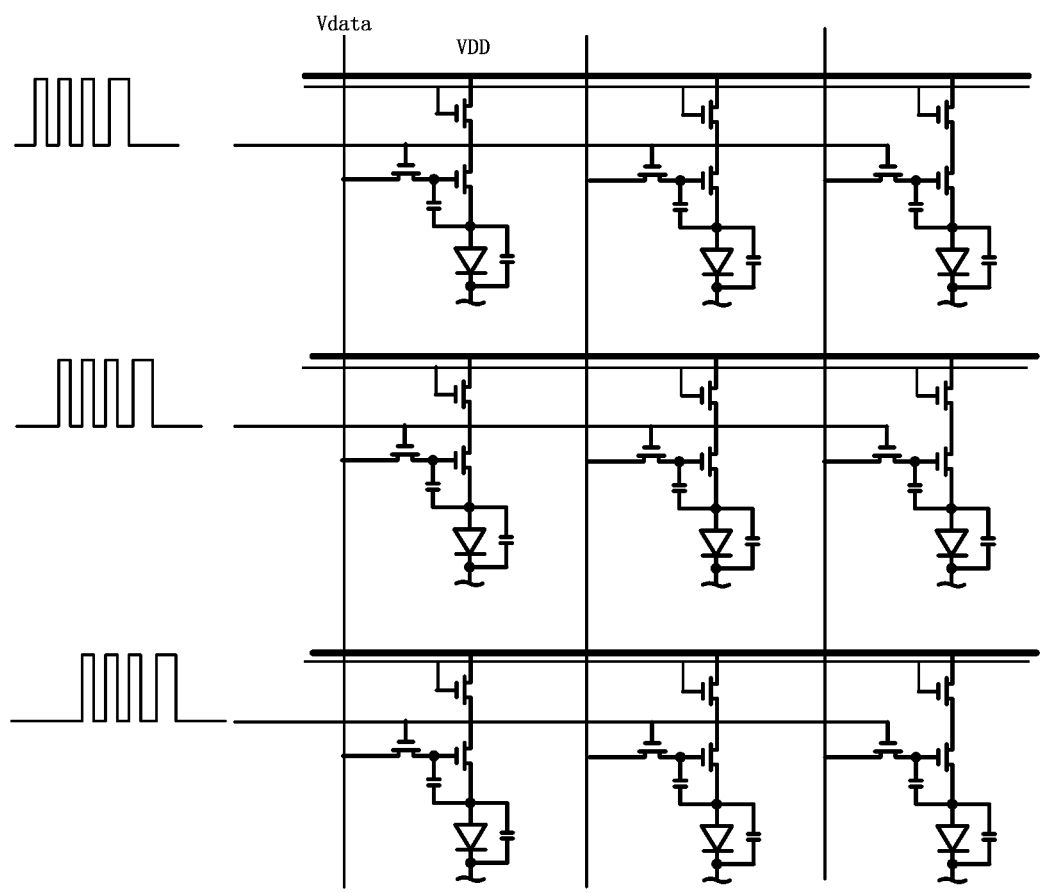
FIG. 1 is a diagram of an active matrix in the related art.
Figure 2:
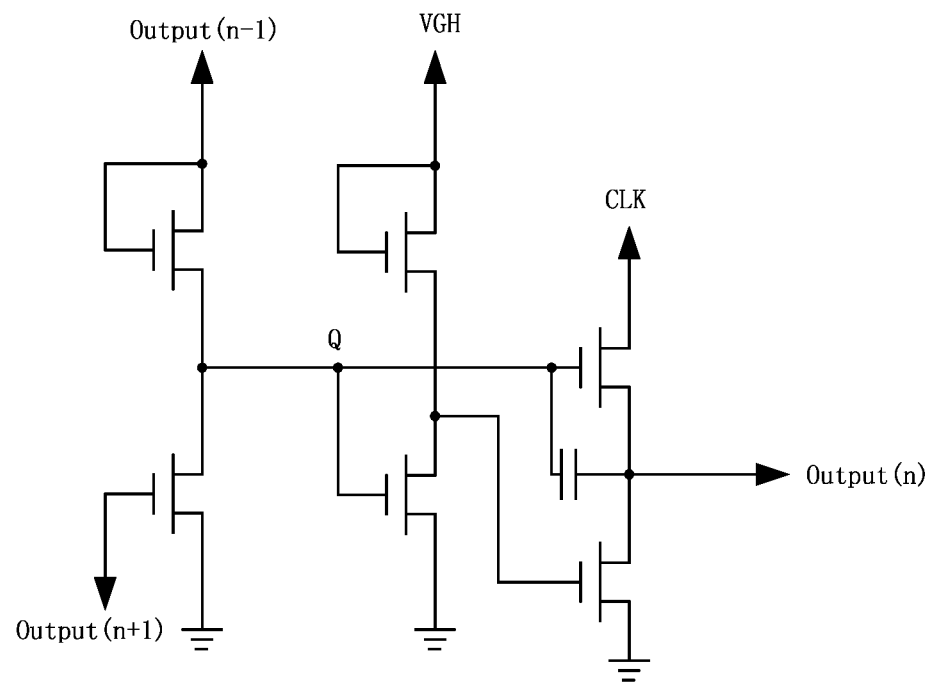
FIG. 2 is a structural diagram of an existing GOA circuit.
Figure 3:
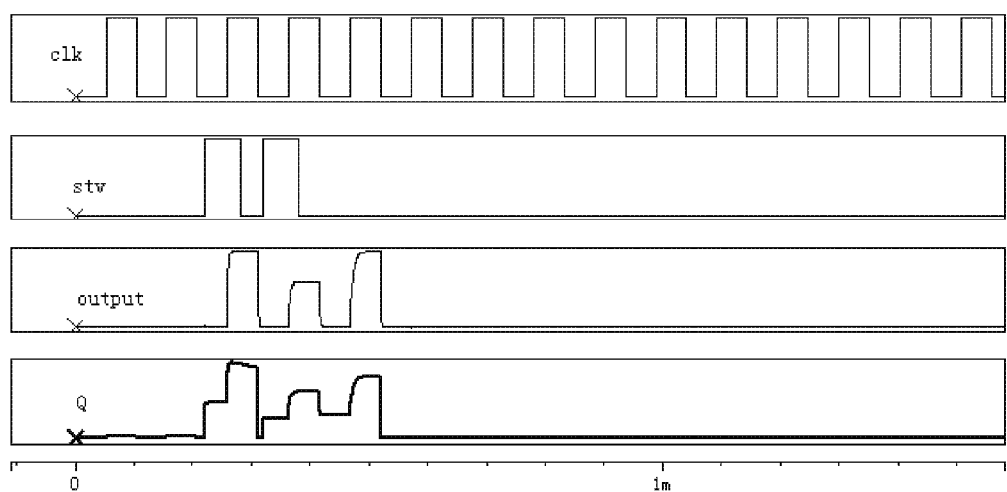
FIG. 3 is a diagram of a simulation result of an output signal when dual pulses are input into an existing GOA circuit.
Figure 4:
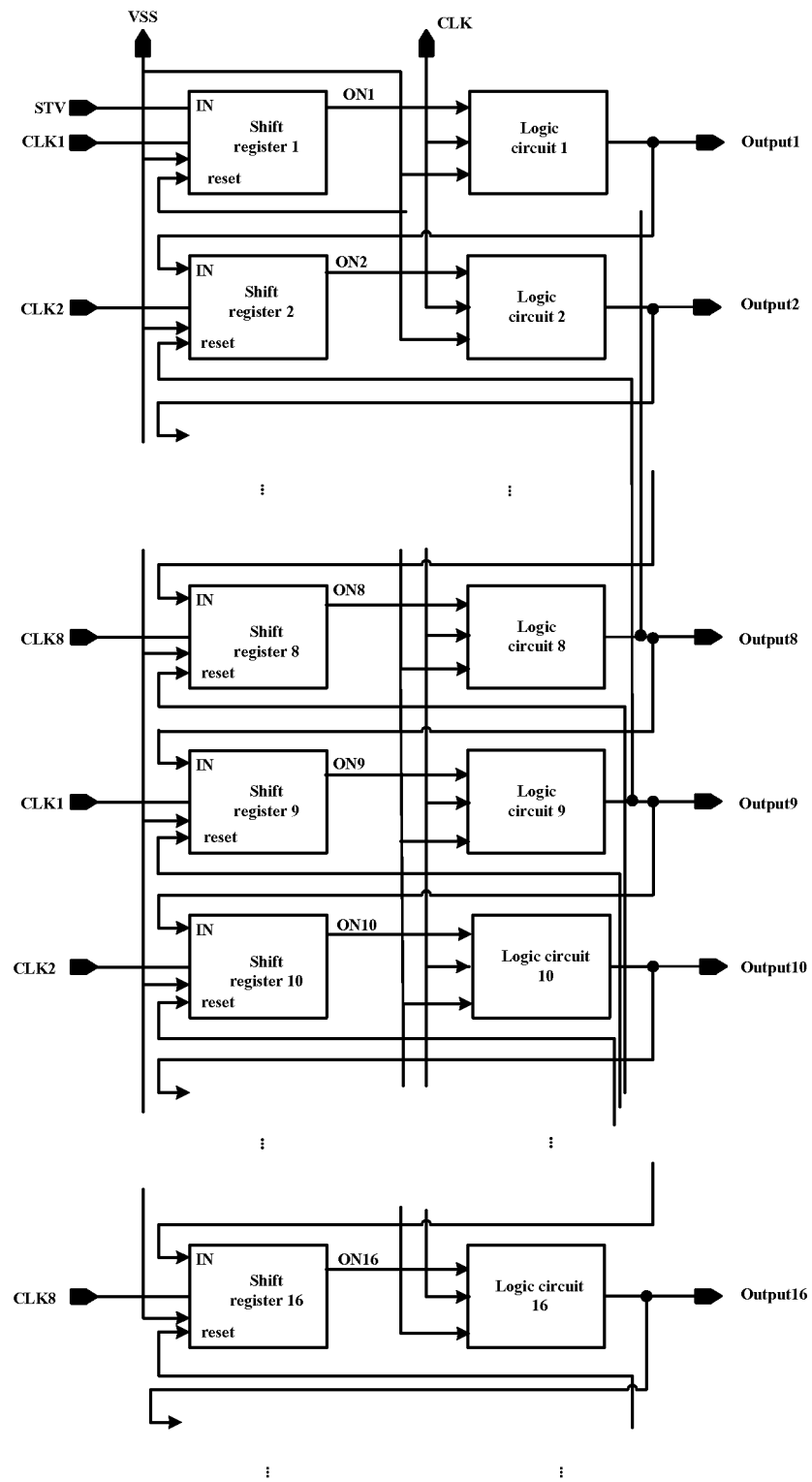
FIG. 4 is a structural diagram of a gate driver circuit according to an embodiment of the present disclosure.

As shown in FIG. 4, a gate driver according to an embodiment of the present disclosure comprises multiple groups of driving units, each group of driving units comprising N driving units, each of which comprises a shift register and a logic circuit. In the present embodiment, each driving unit comprises a shift register and a logic circuit, and corresponds to a row of pixels, and N is an integer larger than 1. In the present embodiment, N=8, and an output of a shift register is connected to a logic circuit in each driving unit. In FIG. 4, ON1 represents an output of a shift register in a 1$^{st}$ driving unit, ON2 represents an output of a shift register in a 2$^{nd}$ driving unit, ON3 represents an output of a shift register in a 3$^{rd}$ driving unit, and so on, until ON16 represents an output of a shift register in a 16$^{th}$ driving unit.

An output of a logic circuit in an m$^{th}$ driving unit is connected to a gate scan line of an m$^{th}$ row of pixels, to provide a gate drive signal to the m$^{th}$ row of pixels. The output of the logic circuit in the m$^{th}$ driving unit is also connected to an input IN of a shift register in an m+1$^{th}$ driving unit, wherein m is in a range of [1, M−1], and M is a total number of rows of pixels. That is, as shown in FIG. 4, an output of a logic circuit in a 1$^{st}$ driving unit is connected to an input IN of a shift register in the 2$^{nd}$ driving unit, an output of a logic circuit in a 2$^{nd}$ driving unit is connected to an input IN of a shift register in the 3$^{rd}$ driving unit, an output of a logic circuit in a 3$^{rd}$ driving unit is connected to an input IN of a shift register in a 4$^{th}$ driving unit, and so on, until an output of a logic circuit in a 15$^{th}$ driving unit is connected to an input IN of a shift register in the 16$^{th}$ driving unit.

In FIG. 4, Output 1 represents the output of a logic circuit in the 1$^{st}$ driving unit, Output 2 represents the output of a logic circuit in the 2$^{nd}$ driving unit, Output 3 represents the output of a logic circuit in the 3$^{rd}$ driving unit, and so on, until Output 16 represents an output of a logic circuit in a 16$^{th}$ driving unit; Shift register 1 represents a shift register in the 1$^{st}$ driving unit, Shift register 2 represents a shift register in the 2$^{nd}$ driving unit, Shift register 3 represents a shift register in the 3$^{rd}$ driving unit, and so on, until Shift register 16 represents a shift register in the 16$^{th}$ driving unit; and Logic circuit 1 represents a logic circuit in the 1$^{st}$ driving unit, Logic circuit 2 represents a logic circuit in the 2$^{nd}$ driving unit, Logic circuit 3 represents a logic circuit in the 3$^{rd}$ driving unit, and so on, until Logic circuit 16 represents a logic circuit in the 16$^{th}$ driving unit.

An output of a logic circuit in a k$^{th}$ driving unit is connected to a reset of a shift register in a k−(N−1)$^{th}$ driving unit, wherein k is in a range of [N, M]. In the present embodiment, k starts from 8. That is, an output of a logic circuit in a 8$^{th}$ driving unit is connected to a reset of a shift register in the 1$^{st}$ driving unit, an output of a logic circuit in a 9$^{th}$ driving unit is connected to a reset of a shift register in the 2$^{nd}$ driving unit, an output of a logic circuit in a 10$^{th}$ driving unit is connected to a reset of a shift register in the 3$^{rd}$ driving unit, and so on.

All logic circuits use a common clock signal (which is represented by CLK below as in FIG. 4) with a pulse width equal to a first pulse width and a pulse period equal to a first pulse period.

In each group of driving units (i.e., driving units in every 8 driving units), shift registers in various driving units multiplex N clock signals with different timings. Each of the clock signals has a pulse width equal to a second pulse width and a pulse period equal to a second pulse period. The second pulse width is 2(N−1) times the first pulse width, and the second pulse period is N times the first pulse period. An n$^{th}$ clock signal is input into a shift register in an n$^{th}$ driving unit, a timing of an n+1$^{th}$ clock signal is the first pulse period later than that of the n$^{th}$ clock signal. A logic circuit in each driving unit outputs a signal having N−1 pulses with a pulse width equal to the first pulse width. A timing of an output signal of a logic circuit in an n+1$^{th}$ driving unit is the first pulse period later than that of an output signal of a logic circuit in an n$^{th}$ driving unit, wherein n is in a range of [1, N−1].

In the present embodiment, N=8. A shown in FIG. 4, 8 clock signals with different timings which are multiplexed by shift registers in every 8 driving units are CLK1, CLK2 . . . CLK8 respectively. In each group of driving units, the signal CLK1 is input into a shift register in the 1$^{st}$ driving unit, the signal CLK2 is input into a shift register in the 2$^{nd}$ driving unit, and so on, until the signal CLK8 is input into a shift register in a 8$^{th}$ driving unit.

Figure 5:
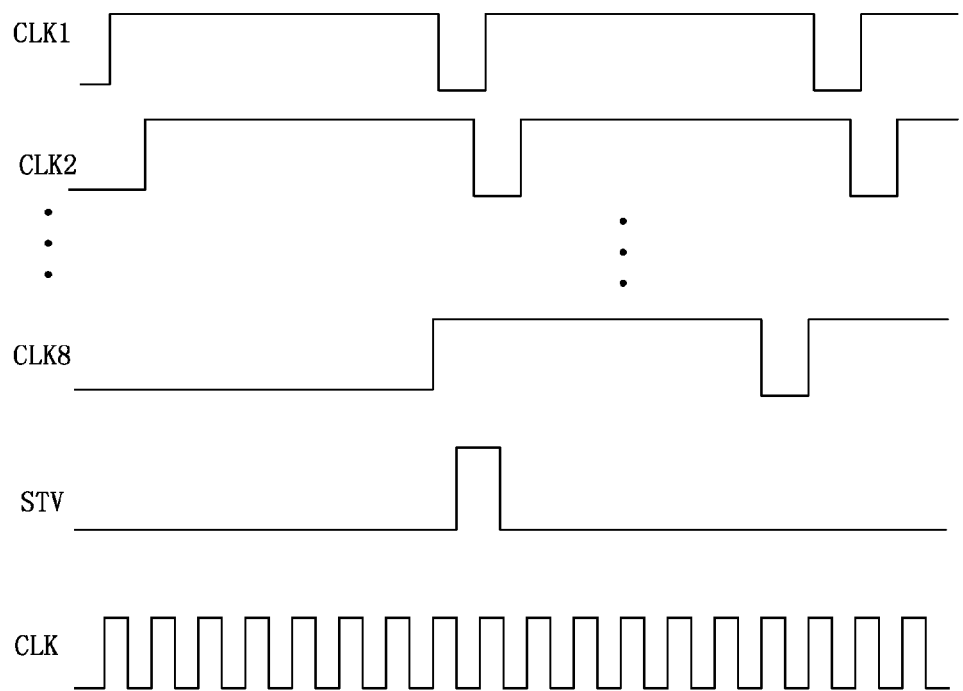
FIG. 5 is diagram of a timing relationship among clock signals multiplexed by shift registers in every 8 driving units, a common clock signal used by all logic circuits, and an initial trigger signal STV input into a shift register in a 1$^{st}$ driving unit according to an embodiment of the present disclosure.

A timing relationship among the 8 clock signals CLK1, CLK2 . . . CLK8 with different timings which are multiplexed by shift registers in every 8 driving units, the common clock signal CLK used by all logic circuits, and an initial trigger signal STV input into a shift register in the 1$^{st}$ driving unit is shown in FIG. 5.

Figure 6:
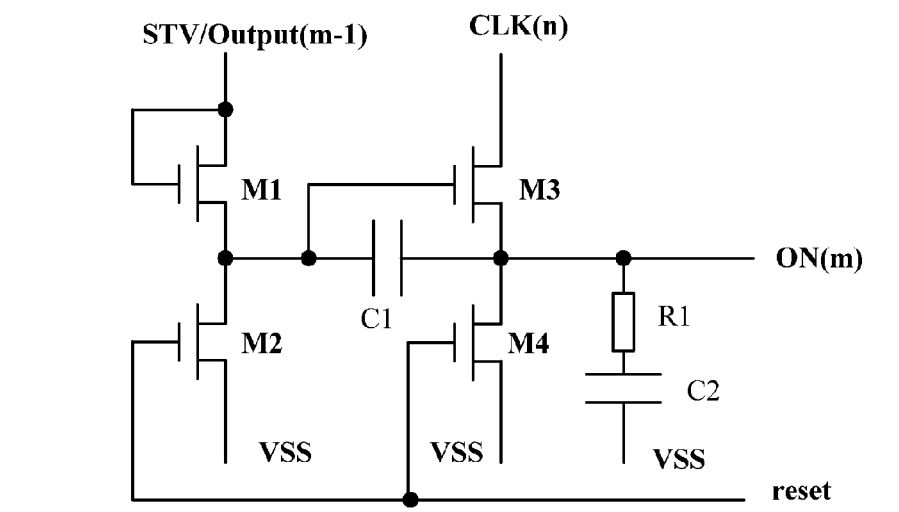
FIG. 6 is a structural diagram of a shift register circuit according to an embodiment of the present disclosure.

With reference to FIG. 6, a shift register in an m$^{th}$ driving unit comprises a first thin film transistor M1, a second thin film transistor M2, a third thin film transistor M3, a fourth thin film transistor M4, a first capacitor C1, a second capacitor C2, and a resistor R1.

A gate of the first thin film transistor M1 is shorted to a source of the first thin film transistor M1. When m is equal to 1, the gate acts as an input for an initial trigger signal STV, and when m is larger than 1, the gate is connected to an output Output(m−1) of a logic circuit in an m−1$^{th}$ driving unit as an input for a trigger signal of the shift register.

The first thin film transistor M1 is connected to the second thin film transistor M2 in series, and a connection point between the first thin film transistor M1 and the second thin film transistor M2 is connected to one end of the first capacitor C1 and a gate of the third thin film transistor M3. The third thin film transistor M3 is connected to the fourth thin film transistor M4 in series, and a connection point between the third thin film transistor M3 and the fourth thin film transistor M4 is connected to the other end of the first capacitor C1 and one end of the resistor R1, and acts as an output ON(m) of the shift register. A source of the third thin film transistor M3 acts as an input for a clock signal CLK(n). Both a gate of the second thin film transistor M2 and a gate of the fourth thin film transistor M4 act as a reset of the shift register. The other end of the resistor R1 is connected to one end of the second capacitor C2, and the other end of the second capacitor C2, a drain of the second thin film transistor M2, and a drain of the fourth thin film transistor M4 act as an input for a low level signal VSS. The specific GOA circuit is not limited in the present disclosure.

Figure 7:
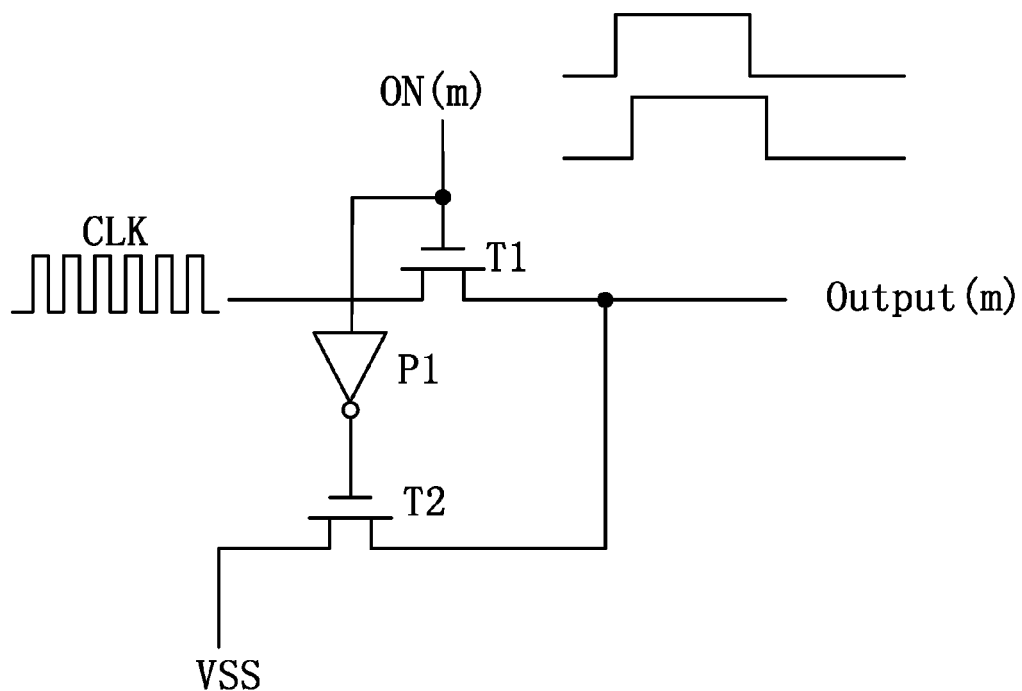
FIG. 7 is a structural diagram of a logic circuit according to an embodiment of the present disclosure.

With reference to FIG. 7, a logic circuit in an m$^{th}$ driving unit comprises a first thin film transistor T1, a second thin film transistor T2, and an inverter P1 connected between a gate of the first thin film transistor T1 and a gate of the second thin film transistor T2.

A drain of the first thin film transistor T1 is connected to a drain of the second thin film transistor T2, and acts as an output Output(m) of the logic circuit. A source of the first thin film transistor T1 acts as an input for the common clock signal CLK used by the logic circuits. The gate of the first thin film transistor T1 acts as an input connected to an output ON(m) of a shift register in the $m^{th}$ driving unit. A source of the second thin film transistor T2 acts as an input for a low level signal VSS.

Figure 8:
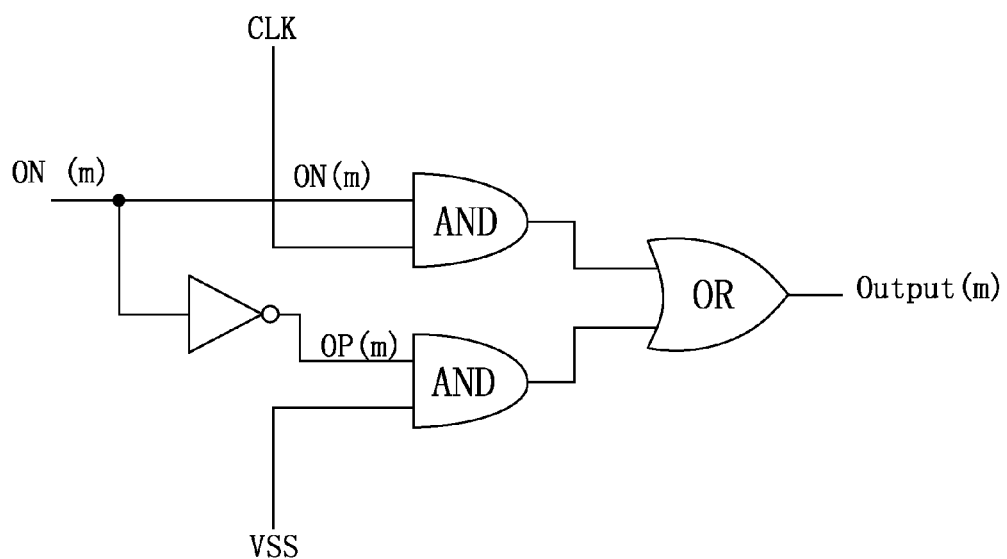
FIG. 8 is a structural diagram of an equivalent circuit of the logic circuit illustrated in FIG. 7 according to an embodiment of the present disclosure.

FIG. 8 illustrates an equivalent circuit of the logic circuit illustrated in FIG. 7, wherein OP(m) represents an inverse signal of an output signal of ON(m). That is, the logic circuit according to the present embodiment is equivalent to being comprised of an inverter, two AND gates, and an OR gate.

Figure 9:
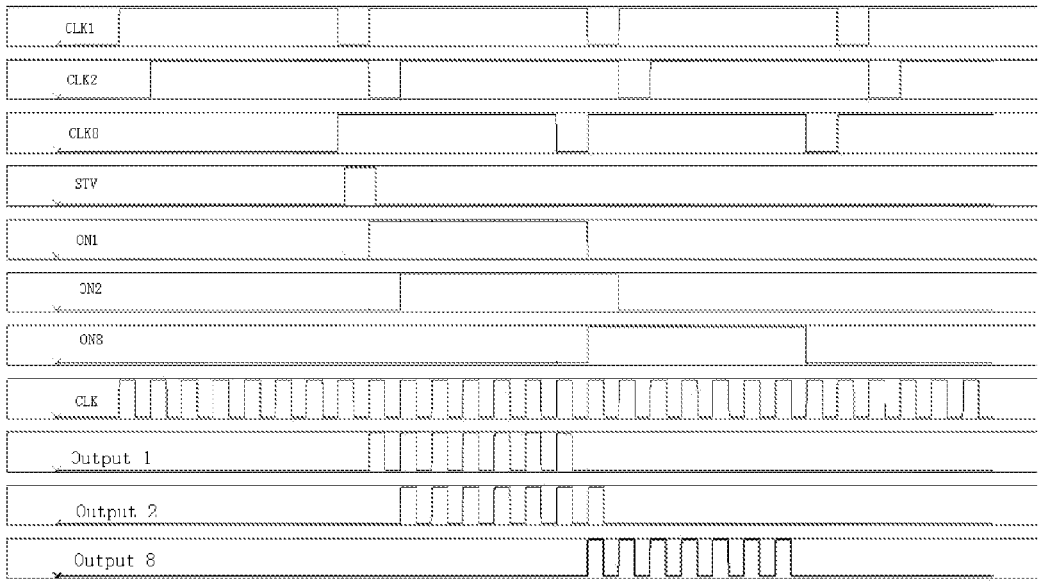
FIG. 9 is a diagram of a simulation result of a gate driver according to an embodiment of the present disclosure.

With reference to FIG. 9, in the present embodiment, there are 8 clock signals CLK1, CLK2 . . . CLK8 with different timings for shift registers. The shift registers multiplex the 8 clock signals to generate 8 clock signals respectively. Each of the generated clock signals has a wide pulse width which is 14 times a narrow pulse width of a clock signal CLK input into a source of a thin film transistor T1 of a logic circuit. That is, a pulse of the clock signal generated by the shift register corresponds to 7 pulses of the clock signal of the logic circuit. A multi-pulse output signal Outputn with 7 pulses is obtained by implementing logic AND, NOT and OR operations on the two clock signals for selection.

It can be seen from a simulation result illustrated in FIG. 9 that after multiplexing the clock signals CLK1, CLK2 . . . CLK8, the shift registers generate waveforms of output signals ON1-ON8. In this simulation, a pulse width of an output signal ON is 14 times of a narrow pulse width of the clock signal CLK to be used for selection. After a logic NOT operation is implemented on the output signal ON to generate a first signal, the first signal is input into the thin film transistor T2 in FIG. 7 as a logic OR circuit for use. A logic AND operation is implemented on the output signal ON and the clock signal CLK for selection to generate a second signal. Then a logic OR operation is implemented on the first signal and the second signal to finally obtain an output signal Outputn with 7 pulses. That is, an output with 7 pulses is generated by processing the clock signal CLK. In this way, a function of outputting a multi-pulse waveform by a gate driver is achieved, which prepares for a shift register having a function of threshold voltage compensation, to make a shift register capable of multi-row scanning become feasible on a display panel, which solves the technical problem of multi-row scanning on a glass panel.

A display apparatus according to the embodiment of the present disclosure comprises the above gate driver (GOA) according to the embodiment of the present disclosure. The display apparatus may be an OLED display for example.

Figure 10:
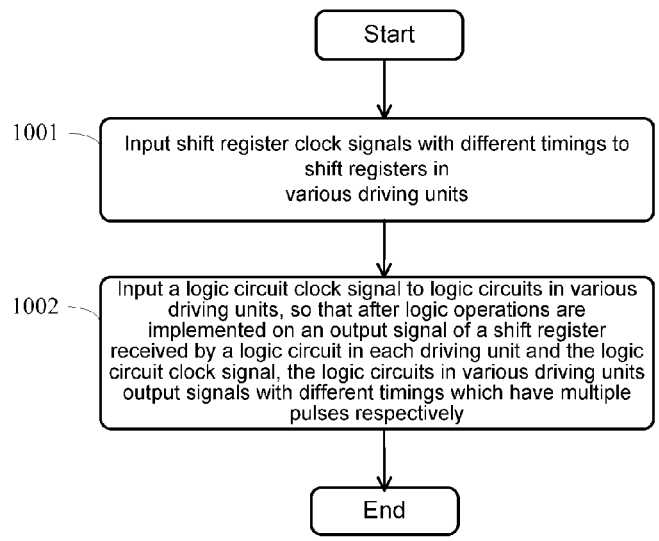
FIG. 10 is a flowchart of a gate driving method using a gate driver according to an embodiment of the present disclosure.

With reference to FIG. 10, a gate driving method using the gate driver according to the embodiment of the present disclosure comprises:

in each group of driving units:

in operation 1001, inputting shift register clock signals with different timings to shift registers in various driving units; and in operation 1002, inputting a logic circuit clock signal to logic circuits in various driving units, so that after logic operations are implemented on an output signal of a shift register received by a logic circuit in each driving unit and the logic circuit clock signal, the logic circuits in the various driving units output signals with different timings which have multiple pulses respectively, each of the multiple pulses having a pulse width equal to that of the logic circuit clock signal.

Preferably, the logic circuit clock signal has a pulse width equal to a first pulse width and a pulse period equal to a first pulse period.

In each group of driving units, each shift register clock signal has a pulse width equal to a second pulse width and a pulse period equal to a second pulse period, wherein the second pulse width is larger than the first pulse width, and the second pulse period is larger than the first pulse period.

Preferably, the second pulse width is 2*(N−1) times the first pulse width, and the second pulse period is N times the first pulse period.

In each group of driving units, a timing of an $n+1^{th}$ shift register clock signal is the first pulse period later than an $n^{th}$ shift register clock signal; and a logic circuit in each driving unit outputs an output signal having N−1 pulses with a pulse width equal to the first pulse width, and a timing of an output signal of a logic circuit in an $n+1^{th}$ driving unit is the first pulse period later than that of an output signal of a logic circuit in an $n^{th}$ driving unit, wherein n is in a range of [1, N−1].

Obviously, those skilled in the art can make various modifications and variations to the present disclosure without departing from the spirit and scope of the present disclosure. Thus, if these modifications and variations of the present disclosure belong to the scope of the claims of the present disclosure and the equivalent technologies thereof, the present disclosure is also intended to include these modifications and variations.

We claim:

1. A gate driver, comprising:
    multiple groups of driving units, each group of driving units comprising N driving units each of which comprises a shift register and a logic circuit, wherein N is an integer larger than 1, and an output of the shift register is connected to the logic circuit in each driving unit,
    wherein an output of a logic circuit in an $m^{th}$ driving unit is connected to a gate scan line of an $m^{th}$ row of pixels, and is connected to an input for a trigger signal of a shift register in an $m+1^{th}$ driving unit, wherein m is in a range of [1, M−1], and M is a total number of rows of pixels;
    an output of a logic circuit in a $k^{th}$ driving unit is connected to a reset of a $k-(N-1)^{th}$ of a shift register, wherein k is in a range of [N, M]; and
    all logic circuits in the multiple groups of driving units use a common logic circuit clock signal;
    wherein the logic circuit clock signal has a pulse width equal to a first pulse width and a pulse period equal to a first pulse period; and
    wherein in each group of driving units, shift registers in various driving units multiplex N shift register clock signals with different timings, wherein each of the N shift register clock signals has a pulse width equal to a second pulse width and a pulse period equal to a second pulse period, wherein the second pulse width is larger than the first pulse width, and the second pulse period is larger than the first pulse period.

2. The gate driver according to claim 1, wherein logic circuits in various driving units output output signals with different timings which have multiple pulses respectively, each of the multiple pulses having a pulse width equal to that of the logic circuit clock signal.

3. The gate driver according to claim 1, wherein a logic circuit in the $m^{th}$ driving unit comprises a first thin film transistor, a second thin film transistor, and an inverter connected between a gate of the first thin film transistor and a gate of the second thin film transistor, wherein a drain of the first thin film transistor is connected to a drain of the second thin film transistor, and acts as an output of the logic circuit; a source of the first thin film transistor acts as an input for the logic circuit clock signal; the gate of the first thin film transistor acts as an input connected to an output of a shift register in an $m^{th}$ driving unit; and a source of the second thin film transistor acts as an input for a low level signal.

4. The gate driver according to claim 1, wherein the second pulse width is 2*(N−1) times the first pulse width, and the second pulse period is N times the first pulse period, and in each group of driving units, a timing of an $n+1^{th}$ shift register clock signal is the first pulse period later than an $n^{th}$ shift register clock signal; and a logic circuit in each driving unit outputs an output signal having N−1 pulses with a pulse width equal to the first pulse width, and a timing of an output signal of a logic circuit in an $n+1^{th}$ driving unit is the first pulse period later than that of an output signal of a logic circuit in an $n^{th}$ driving unit, wherein n is in a range of [1, N−1].

5. The gate driver according to claim 1, wherein each driving unit comprises the shift register and the logic circuit for each row of pixels.

6. The gate driver according to claim 4, wherein a shift register in an $m^{th}$ driving unit comprises a first thin film register, a second thin film register, a third thin film register, a fourth thin film register, a first capacitor, a second capacitor, and a resistor, wherein a gate of the first thin film transistor is shorted to a source of the first thin film transistor, and when m is equal to 1, the gate acts as an input for an initial trigger signal, and when m is larger than 1, the gate is connected to an output of a logic circuit in an $m-1^{th}$ driving unit as an input for a trigger signal of the shift register; and the first thin film transistor is connected to the second thin film transistor in series, a connection point between the first thin film transistor and the second thin film transistor is connected to one end of the first capacitor and a gate of the third thin film transistor, the third thin film transistor is connected to the fourth thin film transistor in series, a connection point between the third thin film transistor and the fourth thin film transistor is connected to the other end of the first capacitor and one end of the resistor, and acts as an output of the shift register, a source of the third thin film transistor acts as an input for a clock signal, both a gate of the second thin film transistor and a gate of the fourth thin film transistor act as a reset of the shift register, the other end of the resistor is connected to one end of the second capacitor, and the other end of the second capacitor, a drain of the second thin film transistor, and a drain of the fourth thin film transistor act as an input for a low level signal.

7. A display apparatus, comprising the gate driver according to claim 1.

8. A gate driving method using the gate driver according to claim 1, comprising:

in each group of driving units:

inputting shift register clock signals with different timings to shift registers in various driving units; and inputting a logic circuit clock signal to logic circuits in various driving units, so that after logic operations are implemented on an output signal of a shift register received by a logic circuit in each driving unit and the logic circuit clock signal, the logic circuits in various driving units output output signals with different timings which have multiple pulses respectively, each of the multiple pulses having a pulse width equal to that of the logic circuit clock signal.

* * * * *